(12) United States Patent
Hirao (10) Patent No.: US 10,424,501 B2
(45) Date of Patent: Sep. 24, 2019

(54) ELECTRONIC DEVICE AND METHOD OF MANUFACTURING ELECTRONIC DEVICE

(71) Applicant: Sony Semiconductor Solutions Corporation, Kanagawa (JP)

(72) Inventor: Naoki Hirao, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 15/560,207

(22) PCT Filed: Mar. 9, 2016

(86) PCT No.: PCT/JP2016/057352
§ 371 (c)(1),
(2) Date: Sep. 21, 2017

(87) PCT Pub. No.: WO2016/158264
PCT Pub. Date: Oct. 6, 2016

(65) Prior Publication Data
US 2018/0047608 A1   Feb. 15, 2018

(30) Foreign Application Priority Data
Mar. 30, 2015   (JP) .................................. 2015-069261

(51) Int. Cl.
| | |
|---|---|
| *H01L 21/00* | (2006.01) |
| *H01L 33/00* | (2010.01) |
| *H01L 31/0232* | (2014.01) |
| *H01L 21/683* | (2006.01) |

(Continued)

(52) U.S. Cl.
CPC .......... *H01L 21/6835* (2013.01); *H01L 27/14* (2013.01); *H01L 33/0095* (2013.01);
(Continued)

(58) Field of Classification Search
CPC .. H01L 21/6835; H01L 27/14; H01L 33/0095
(Continued)

(56) References Cited

U.S. PATENT DOCUMENTS

| | | |
|---|---|---|
| 2004/0195569 A1 | 10/2004 | Hashimoto et al. |
| 2005/0280041 A1 | 12/2005 | Hashimoto et al. |

(Continued)

FOREIGN PATENT DOCUMENTS

| | | |
|---|---|---|
| JP | 2002-314053 A | 10/2002 |
| JP | 2004-184754 A | 7/2004 |

(Continued)

OTHER PUBLICATIONS

Jignesh Patel et al Thermal Study of Anhydrides Cured Tetrafunctional Cardo Epoxy Resins—Published 2013, Hindawi Publishing Corporation Indian Journal of Materials Science vol. 2013 pp. 1-6.*

(Continued)

*Primary Examiner* — David S Blum
(74) *Attorney, Agent, or Firm* — Wolf, Greenfield & Sacks, P.C.

(57) ABSTRACT

A method of manufacturing an electronic device includes: in transferring one or a plurality of element sections onto a first substrate from a second substrate, forming part or all of the one or the plurality of element sections on the second substrate with a resin layer in between; peeling off the one or the plurality of element sections that are formed on the second substrate from the second substrate through laser irradiation performed on the resin layer, and disposing, onto the first substrate, the one or the plurality of element sections peeled off; and using, as the resin layer, resin having glass-transition temperature and thermal decomposition temperature that differ from each other by 150 degrees centigrade or less.

16 Claims, 8 Drawing Sheets

(51) Int. Cl.
*H01L 27/14* (2006.01)
*H01L 27/12* (2006.01)

(52) U.S. Cl.
CPC ............ *H01L 27/1266* (2013.01); *H01L 2221/68322* (2013.01); *H01L 2221/68386* (2013.01)

(58) Field of Classification Search
USPC ................................ 438/25; 257/99, 435
See application file for complete search history.

(56) References Cited

U.S. PATENT DOCUMENTS

| | | |
|---|---|---|
| 2010/0258543 A1 | 10/2010 | Mizuno et al. |
| 2014/0311680 A1* | 10/2014 | Kubo ............... H01L 21/6835 156/711 |

FOREIGN PATENT DOCUMENTS

| | | | |
|---|---|---|---|
| JP | 2004184754 A | * | 7/2004 |
| JP | 2004-228373 A | | 8/2004 |
| JP | 2010-251359 A | | 11/2010 |

OTHER PUBLICATIONS

International Search Report and Written Opinion and English translation thereof dated Jun. 7, 2016 in connection with International Application No. PCT/JP2016/057352.

International Preliminary Report on Patentability and English translation thereof dated Oct. 12, 2017 in connection with International Application No. PCT/JP2016/057352.

* cited by examiner

ELECTRONIC DEVICE AND METHOD OF MANUFACTURING ELECTRONIC DEVICE

CROSS-REFERENCE TO RELATED APPLICATIONS

This application is a National Stage of International Application No. PCT/JP2016/05732, filed in the Japanese Patent Office as a Receiving office on Mar. 9, 2016, which claims priority to Japanese Patent Application Number 2015-069261, filed in the Japanese Patent Office on Mar. 30, 2015, each of which is hereby incorporated by reference in its entirety.

TECHNICAL FIELD

The disclosure relates to a method of manufacturing an electronic device in which a light-emitting element or a light-receiving element, or any other element is formed on a substrate through transfer from another substrate, and to an electronic device that is fabricated by such a manufacturing method.

BACKGROUND ART

There is a technology of processing resin in such a manner that the resin is irradiated with a laser beam from the YAG laser, the excimer laser, or any other laser, resulting in the resin being subjected to so-called ablation. Further, there is another technology of peeling off a light-emitting element in such a manner that resin is used for a peel-off layer at the time of forming the light-emitting element on a substrate through transfer from another substrate, and the resin is irradiated with a laser beam, resulting in the resin being subjected to the ablation (for example, see PTL 1).

The use of the resin as the peel-off layer has various advantages including allowing for peeling-off at low energy, as compared with the use of an inorganic material such as amorphous silicon.

CITATION LIST

Patent Literature

[PTL 1] Japanese Unexamined Patent Application Publication No. 2010-251359

SUMMARY OF THE INVENTION

In the method mentioned in the above-described PTL 1, it is more likely that dust called debris will be generated during laser ablation of the resin. The dust may be an alteration product of the resin that is caused by the ablation, or a product that is caused by reaction of the alteration product of the resin to gas in the atmosphere, and it may be difficult to remove the dust using a method such as cleaning. Further, in a process incorporating mechanical factors such as CMP, a surface to be processed is desired to be even. In other words, for an uneven structure, it may be difficult to remove the dust that is generated after the laser ablation in terms of the strength or due to deposition of the dust at a concave portion. If such dust is not removed to be left as it is, the dust may be attached to other structures, causing degradation in device reliability.

Accordingly, it is desirable to provide a method of manufacturing an electronic device, and an electronic device that allow degradation in the reliability to be suppressed.

An electronic device according to one embodiment of the disclosure includes: one or a plurality of element sections that are disposed on a first substrate; and a resin layer that is formed on at least part of each of the one or the plurality of element sections, in which the resin layer includes resin having glass-transition temperature and thermal decomposition temperature that differ from each other by 150 degrees centigrade or less.

A method of manufacturing an electronic device according to one embodiment of the disclosure includes: in transferring one or a plurality of element sections onto a first substrate from a second substrate, forming part or all of the one or the plurality of element sections on the second substrate with a resin layer in between; peeling off the one or the plurality of element sections that are formed on the second substrate from the second substrate through laser irradiation performed on the resin layer, and disposing, onto the first substrate, the one or the plurality of element sections peeled off; and using, as the resin layer, resin having glass-transition temperature and thermal decomposition temperature that differ from each other by 150 degrees centigrade or less.

In the electronic device according to the one embodiment of the disclosure, there are provided: the one or a plurality of element sections that are disposed on the first substrate; and the resin layer that is formed on at least part of each of the one or the plurality of element sections, in which the resin layer includes the resin having the glass-transition temperature and the thermal decomposition temperature that differ from each other by 150 degrees centigrade or less. Consequently, the softening temperature range of the resin becomes narrower in a manufacturing process including the laser ablation of the resin layer, which makes softening of the resin more difficult as a result.

In the method of manufacturing the electronic device according to the one embodiment of the disclosure, in transferring the one or the plurality of element sections onto the first substrate from the second substrate, the one or the plurality of element sections formed on the second substrate with the resin layer in between are peeled off from the second substrate through the laser irradiation performed on the resin layer, and the one or the plurality of element sections peeled off are disposed on the first substrate. Here, by using, as the resin layer, the resin having glass-transition temperature and the thermal decomposition temperature that differ from each other by 150 degrees centigrade or less, the resin is easy to change from a solid state into a gas state efficiently, and is hard to be softened (the probability of being put in a fluid state is lowered) during the laser ablation.

According to the electronic device of one embodiment of the disclosure, there are provided: the one or a plurality of element sections that are disposed on the first substrate; and the resin layer that is formed on at least part of each of the one or the plurality of element sections, in which the resin layer includes the resin having the glass-transition temperature and the thermal decomposition temperature that differ from each other by 150 degrees centigrade or less. This makes it possible to suppress softening of the resin in a manufacturing process including the laser ablation of the resin layer, which allows degradation in the reliability to be suppressed.

According to the method of manufacturing the electronic device of one embodiment of the disclosure, in transferring the one or the plurality of element sections onto the first substrate from the second substrate, the one or the plurality of element sections formed on the second substrate with the resin layer in between are peeled off from the second substrate through the laser irradiation performed on the resin layer, and the one or the plurality of element sections peeled off are disposed on the first substrate. Here, using, as the resin layer, of the resin having glass-transition temperature and the thermal decomposition temperature that differ from each other by 150 degrees centigrade or less makes it possible to suppress softening of the resin during the laser ablation, which allows degradation in the reliability to be suppressed.

It is to be noted that the above content is mere example of the disclosure. The effects of the disclosure are not limited to the description above, and the effects of the disclosure may be other effects, or may further include other effects.

MODES FOR CARRYING OUT THE INVENTION

Hereinafter, some embodiments of the disclosure are described in detail with reference to the drawings. It is to be noted that the description is given in the following order.
1. Embodiment (an example of an electronic device using resin having glass-transition temperature and thermal decomposition temperature that differ from each other by 150 degrees centigrade or less as a peel-off layer for laser ablation in transferring selective element sections)
  Configuration
  Manufacturing method
  Workings and Effects
2. Modification Example 1 (an example of a case where a plurality of element sections are peeled and transferred after bonding)
[Embodiment]
[Configuration]

Figure 1:
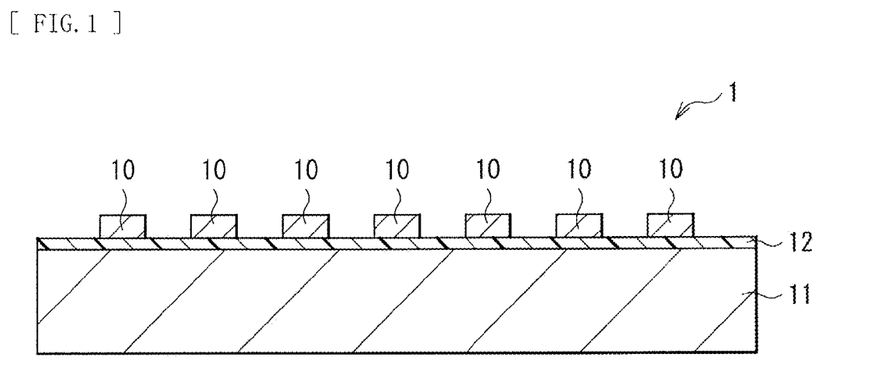
FIG. 1 is a cross-sectional schematic diagram illustrating a simplified configuration of an electronic device according to one embodiment of the disclosure.
Figure 2:
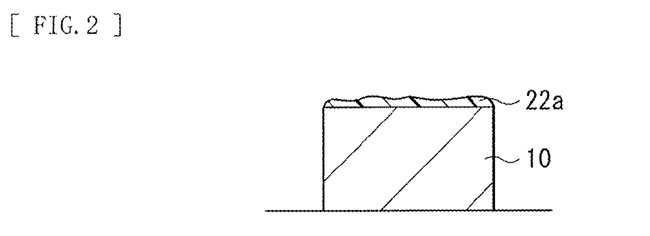
FIG. 2 is a cross-sectional schematic diagram illustrating an example of a resin layer that is formed on an element section illustrated in FIG. 1.

FIG. 1 schematically illustrates a configuration of an electronic device (an electronic device 1) according to one embodiment of the disclosure. FIG. 2 schematically illustrates a configuration of a resin layer 22a that is formed on an element section 10. The electronic device 1 is configured in such a manner that the plurality of element sections 10 are disposed on a first substrate 11 with a bonding layer 12 in between. Examples of the electronic device 1 include a display device such as an LED display, and a solid-state imaging device.

The element section 10 is configured to include, for example, a light-emitting element. The light-emitting element is a light-emitting diode (LED) chip covered with a protective film. The LED chip emits any of color light including, for example, red (R), green (G), and blue (B). These element sections 10A are disposed at spacing intervals of at least several micrometers but no more than several hundred micrometers, for example. These element sections 10 are disposed on the first substrate 11 with the bonding layer 12 in between, and have been transferred from another substrate (a second substrate 21 to be described later) in a manufacturing process. It is to be noted that, in a case where the electronic device 1 is a solid-state imaging device, the element section 10 is configured to include a light-receiving element (a photoelectric conversion element) such as a photodiode. Further, the element section 10 is not limited to such a light-emitting element and a light-receiving element, and the element section 10 may be configured to include any other various semiconductor elements.

On the element section 10, the resin layer 22a is formed on at least part thereof, as illustrated in FIG. 2. The resin layer 22a is formed on the element section 10 after a peel-off process with use of laser ablation to be described later (the resin layer 22a configures part of a peel-off layer 22 to be described later). The resin layer 22a may be formed only on part of the element section 10, or may be formed only on the selective element section 10 among the plurality of element sections 10. Alternatively, in a case where the resin layer 22a is removed after a peel-off treatment, the resin layer 22a may not be formed on the element section 10.

The resin layer 22a includes resin that has glass-transition temperature and thermal decomposition temperature, and that is softened, gasified, or brought in a plasma state by absorbing a laser beam. Further, the "thermal decomposition temperature" in the present specification refers to temperature at the time when a reduction in mass of the resin starts when temperature is raised gradually. The resin to be used for the resin layer 22a exhibits temperature of 150 degrees centigrade or less as a difference between the glass-transition temperature and the thermal decomposition temperature. An example of the resin exhibiting temperature of 150 degrees centigrade or less as a difference between the glass-transition temperature and the thermal decomposition temperature may include a polymer material (cardo-type resin) having a cardo structure illustrated in Chemical Formula 1 given below. The cardo structure has a hinge-like structure in which four aromatic rings bind to one carbon atom.

Here, in the ablation, great importance is placed on the processing performance (or the transfer performance) thereof. At the time of a processing treatment, when the resin reaches the glass-transition temperature (softening temperature) without being subjected to the ablation, energy is transferred to an interlayer film made of resin (interlayer resin) that is formed at the periphery of the resin that has reached the glass-transition temperature without being subjected to the ablation, which may induce softening of the interlayer resin. This may cause shape abnormality (modification), or welding with a peel-off surface at the time of transfer, for example. Accordingly, in the present embodiment, the difference between the glass-transition temperature and the thermal decomposition temperature of the resin to be used for the peel-off layer is made small to suppress the above-described shape abnormality or welding deposition, for example. Specifically, as a constituent material of the resin layer 22a, resin that exhibits temperature of 150 degrees centigrade or less as the difference between the glass-transition temperature and the thermal decomposition temperature is selected. When the difference is in the order of 150 degrees centigrade, it is possible to select a material having the glass-transition temperature of about 150 degrees centigrade as the surrounding interlayer resin. In other words, this allows for having more choices of the resin to be placed around the resin layer 22a (the resin layer 22), which makes it possible to enhance the degree of freedom in the material selection. By making the difference between the glass-transition temperature and the thermal decomposition temperature further smaller than 150 degrees centigrade, it is possible to further enhance the degree of freedom in the material selection of the interlayer resin.

Further, for the resin included in the resin layer 22a, vapor pressure at room temperature in an oxide, a nitride, and a carbide of an atom contained in a side chain, for example, may be preferably equal to or greater than atmospheric pressure of 1013 hPa. In other words, it is preferable that the resin included in the resin layer 22a do not contain the atom or molecule in which the vapor pressure in an oxide, a nitride, and a carbide thereof is smaller than the atmospheric pressure, specifically, the molecule (for example, $SiO_2$) that is put in a solid state at room temperature.

In addition, the thermal decomposition temperature (for example, the temperature at the time when a reduction in mass of 5% starts) is preferably 350 degrees centigrade or less. This is because activation energy to be described later may tend to be reduced with a decrease in the thermal decomposition temperature. An example of the resin included in the resin layer 22a may include cardo-type acrylic resin having the glass-transition temperature of 220 degrees centigrade and the thermal decomposition temperature of 320 degrees centigrade. Further, in addition to such a material, a fluorene derivative may be mentioned as a resin material having a tendency of exhibiting the high glass-transition temperature and the low thermal decomposition temperature. Specific examples of such a material include phenol having a basic structure (cardo structure) of the fluorene derivative, and acrylate of the fluorene derivative.

The first substrate 11 includes a printed circuit board such as an interposer, for example. On the first substrate 11, a drive IC for the element section 10 is disposed in addition to the element section 10, for example.

The bonding layer 12 serves to bond the element section 10 onto the first substrate 11. The bonding layer 12 may be made of alloy (solder) containing, for example, tin (Sn), copper (Cu), silver (Ag), etc., or may be made of an adhesive agent such as resin.

[Manufacturing Method]

It is possible to form the electronic device 1 in the following manner, for example. FIGS. 3A to 7 are each a schematic diagram for explaining a method of forming element sections 10A.

Figure 3A:
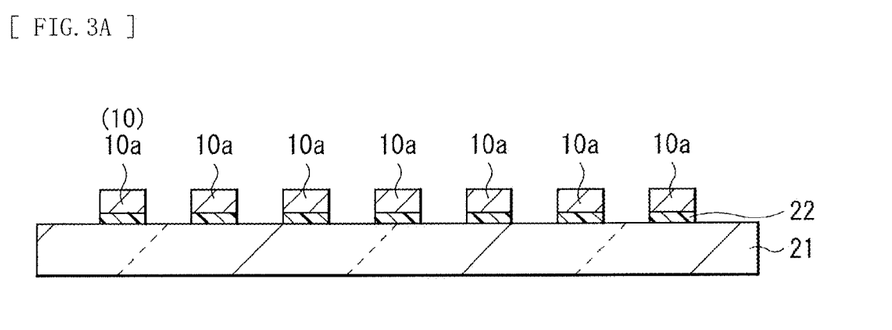
FIG. 3A is a cross-sectional schematic diagram illustrating a configuration of each of a second substrate, a peel-off layer, and the element section that are used in a manufacturing process of the electronic device illustrated in FIG. 1.

First, as illustrated in FIG. 3A, each of the plurality of element sections 10 (termed as element sections 10a for explanatory convenience) is formed on the second substrate 21 with the corresponding peel-off layer 22 in between. As with the above-described resin layer 22a, the peel-off layer 22 includes resin that is subjected to the ablation to be gasified by absorbing a laser beam, and that exhibits temperature of 150 degrees centigrade or less as the difference between the glass-transition temperature and the thermal decomposition temperature. A film thickness of the peel-off layer 22 is, for example, at least 100 nm but no more than 5 μm. Further, more preferably, the peel-off layer 22 is made without containing the atom in which the vapor pressure at room temperature in an oxide, a nitride, and a carbide thereof is smaller than the atmospheric pressure, and has the thermal decomposition temperature of 350 degrees centigrade or less, for example.

Specifically, to begin with, the second substrate 21 is prepared apart from the first substrate 11. The peel-off layer 22 is formed on the second substrate 21, and thereafter, the element sections 10a are formed. The second substrate 21 is made of a material (for example, quartz) that transmits a wavelength of a laser beam therethrough. Further, there are various methods of forming (mounting) the element sections 10a on the peel-off layer 22. As an example, it is possible to form the element sections 10a with use of plating joints in a manner of forming a metallic wiring layer on the peel-off layer 22 using a plating treatment. Alternatively, the element sections 10a may be formed with use of soldering joints in a manner of forming soldering bumps on the backsides of the element sections 10a. As another method, an adhesive layer may be formed on the peel-off layer 22 to bond the element sections 10a.

Thereafter, each of the element sections 10a that are formed on the second substrate 21 is covered with, for example, a protective film that is not illustrated in the diagram to be molded. In a case where the element sections 10a include light-emitting elements (or light-receiving elements), the protective film includes a material that transmits emitted (or received) light therethrough. As an alternative, in a case where the element sections 10a include any other semiconductor elements, a suitable material may be selected in terms of the reliability such as moisture permeability.

Figure 3B:
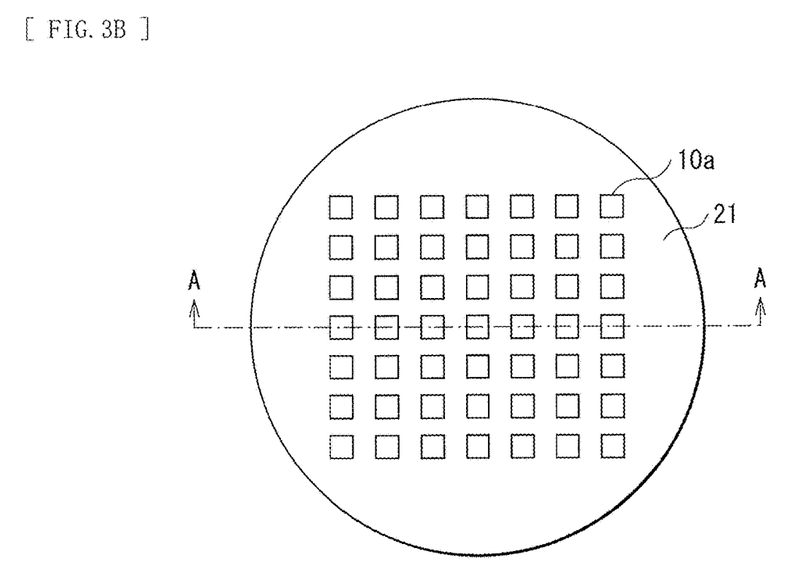
FIG. 3B is a planar schematic diagram of the second substrate illustrated in FIG. 3A.

Next, each of the element sections 10a is separated individually. A separation method is not specifically limitative; however, an example thereof includes dry etching by the use of a photolithographic technique. In such a manner, for example, as illustrated in FIG. 3B, the plurality of element sections 10a are two-dimensionally disposed on the second substrate 21 in a state of being separated from one another. It is to be noted that FIG. 3A is equivalent to a cross-sectional diagram viewing from an arrow direction of a line A-A in FIG. 3B.

Figure 4:
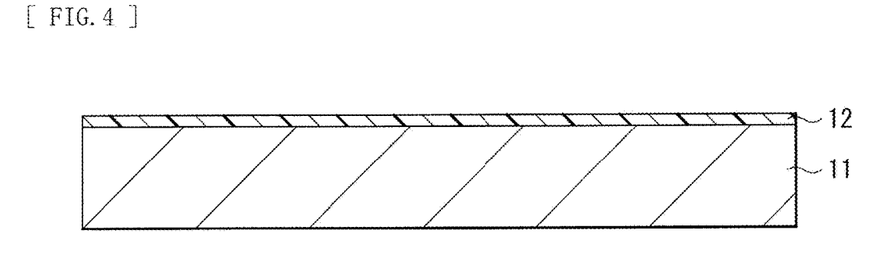
FIG. 4 is a cross-sectional schematic diagram illustrating a configuration each of a first substrate and a bonding layer.

Meanwhile, as illustrated in FIG. 4, the above-described first substrate 11 is prepared, and the bonding layer 12 is formed on the first substrate 11.

Figure 5A:
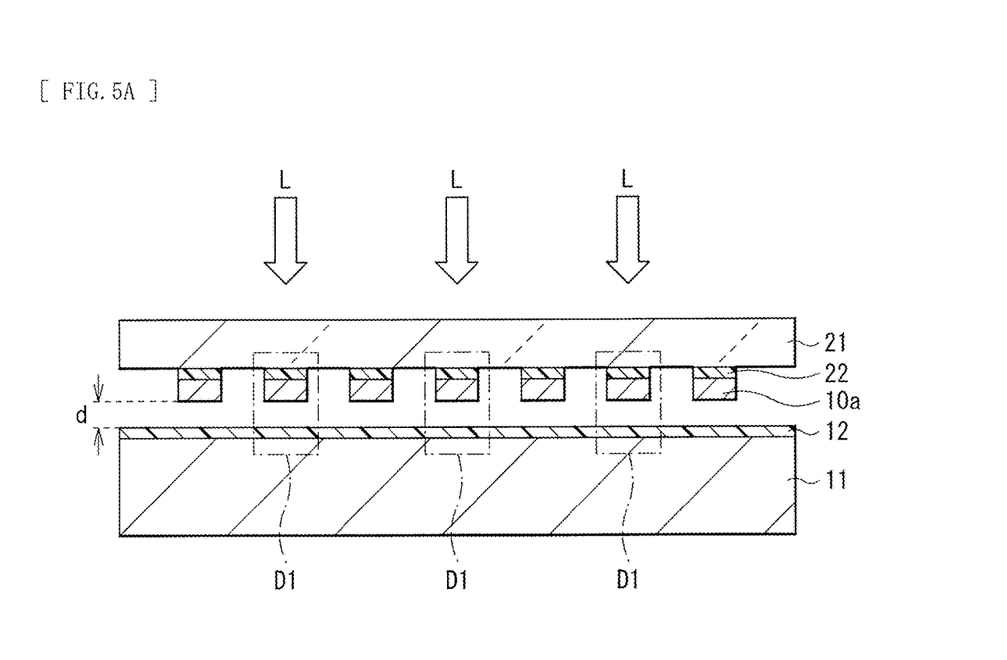
FIG. 5A is a cross-sectional schematic diagram illustrating a peel-off process with use of laser irradiation.

Thereafter, as illustrated in FIG. 5A, the second substrate 21 on which the plurality of element sections 10a are formed is disposed to face the first substrate 11 (specifically, the bonding layer 12). At this time, the first substrate 11 and the second substrate 21 are disposed to face each other in such a manner that the element sections 10a are disposed between the first substrate 11 and the second substrate 21, and first substrate 11 and the second substrate 21 (specifically, the bonding layer 12 and the element sections 10a) are disposed away from each other (with a clearance d in between). At least one of the first substrate 11 and the second substrate 21 is held on a movable stage, and is driven to be fixed at the above-described predetermined position.

With the first substrate 11 and the second substrate 21 disposed to face each other, for example, only in regions D1 corresponding to the selective element sections 10a, the peel-off layer 22 is irradiated with a laser beam L. The laser beam L is emitted from the second substrate 21 side. As a wavelength of the laser beam L, a wavelength of light is selected that passes through the second substrate 21, and is absorbed selectively on the peel-off layer 22. Further, an irradiation diameter and an output intensity, etc. of the laser beam L are set up to allow a whole surface of the peel-off layer 22 within the region D1 to be uniformly irradiated with the laser beam L. Examples of a laser light source include an excimer laser with an output wavelength of 248 nm, and a YAG laser with the output wavelength of 266 nm.

Figure 5B:
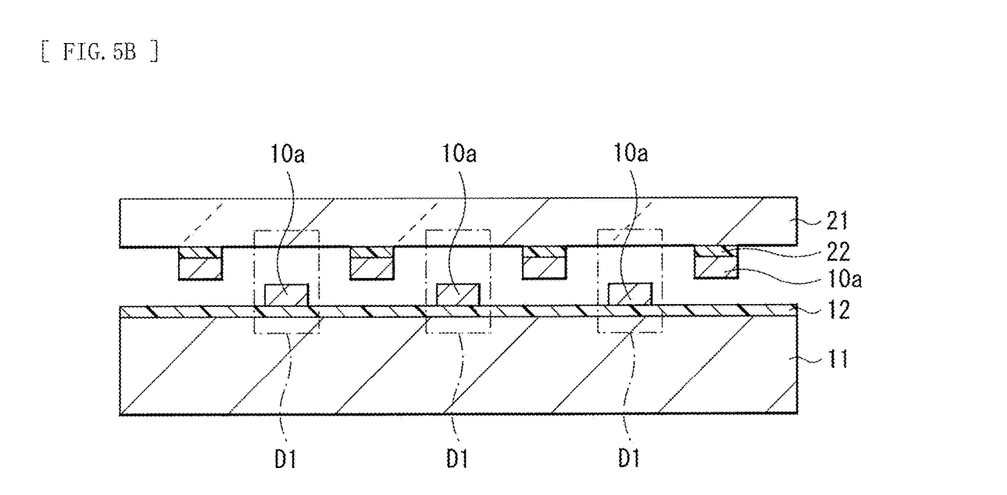
FIG. 5B is a cross-sectional schematic diagram illustrating a process following the process illustrated in FIG. 5A.
Figure 6:
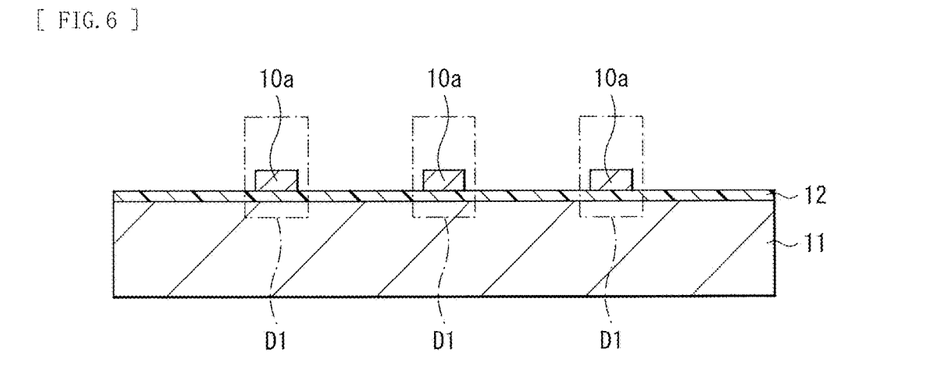
FIG. 6 is a cross-sectional schematic diagram illustrating a process following the process illustrated in FIG. 5B.

As illustrated in FIG. 5B, this ensures that part or all of the peel-off layer 22 within the region D1 is gasified (subjected to the ablation). As a result, the element sections 10a in the regions D1 are peeled off from the second substrate 21 to be dropped down on the bonding layer 12 that is positioned directly beneath, and are fixed as they are by the bonding layer 12. Thereafter, the second substrate 21 is separated from the first substrate 11. In such a manner, the laser ablation with use of the peel-off layer 22 makes it possible to transfer the selective element sections 10a from the second substrate 21 onto the first substrate 11 (FIG. 6). Here, after the element sections 10a are peeled off, part of the resin included in the peel-off layer 22 in the regions D1 is not gasified, and is left on the element sections 10a in an original solid state (the resin layer 22a is formed on at least part of the element sections 10a). The resin layer 22a that is formed on the element sections 10a after laser irradiation may be removed by carrying out an additional treatment such as dry etching, for example. It is to be noted that the element section 10a that is formed on the second substrate 21 corresponds to a specific example of a "first element section" of the disclosure.

Figure 7:
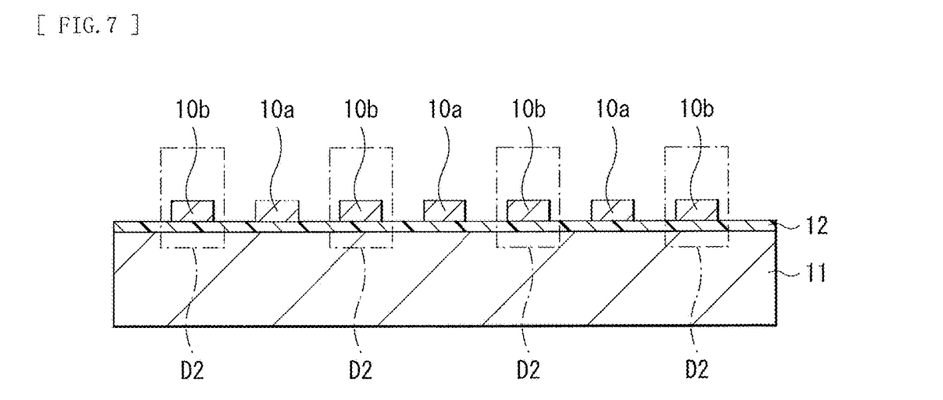
FIG. 7 is a cross-sectional schematic diagram illustrating a process following the process illustrated in FIG. 6.

Thereafter, as illustrated in FIG. 7, in the same manner as that described above, the selective element sections 10 (termed as element sections 10b for explanatory convenience) are peeled off from another substrate (a substrate on which the plurality of element sections 10 are formed like the second substrate 21), and are transferred onto regions D2 on the first substrate 11. This brings the electronic device illustrated in FIG. 1 to completion.

[Workings and Effects]

In the present embodiment, at the time of transferring the element sections 10 onto the first substrate 11 in a manufacturing process of the electronic device 1, the peel-off layer 22 that is subjected to the laser ablation includes resin allowing the difference between the glass-transition temperature and the thermal decomposition temperature to be not more than the predetermined temperature. Such a configuration provides the following effects.

Figure 8:
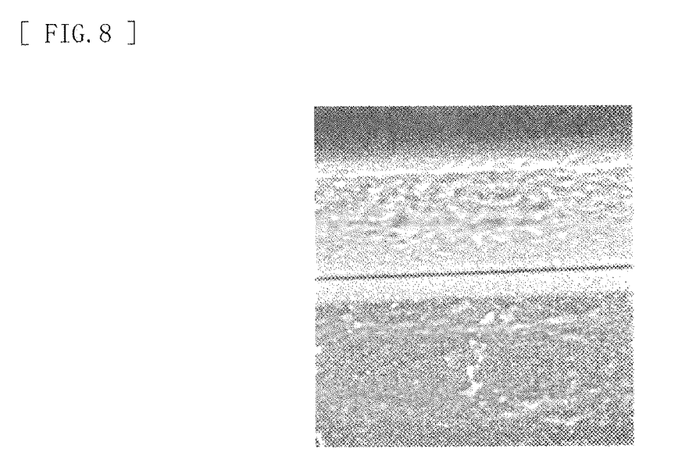
FIG. 8 is a photograph taken for a side surface of a chip after laser ablation according to a comparative example.
Figure 9:
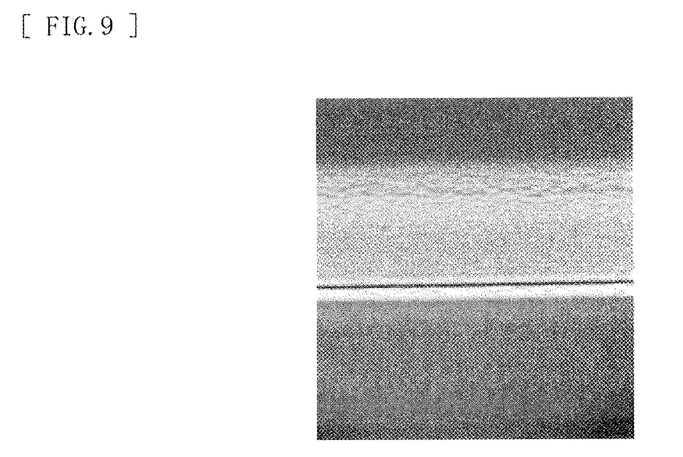
FIG. 9 is a photograph taken for a side surface of a chip after laser ablation according to a working example.

Here, as a comparative example of the present embodiment, FIG. 8 illustrates a photograph taken for a side surface of a chip after ablation in a case where CRC-8300 (name of the product: manufactured by Sumitomo Bakelite Co., Ltd.) is subjected to the laser ablation. The CRC-8300 (name of the product: manufactured by Sumitomo Bakelite Co., Ltd.) is polyimide-based photosensitive resin having the glass-transition temperature of 295 degrees centigrade and the thermal decomposition temperature of 540 degrees centigrade. That is, the resin to be used in the comparative example exhibits the temperature of 245 degrees centigrade that is greater than 150 degrees centigrade as the difference between the glass-transition temperature and the thermal decomposition temperature. Further, as a working example of the present embodiment, FIG. 9 illustrates a photograph taken for a side surface of a chip after ablation in a case where cardo-type acrylic resin having the glass-transition temperature of 220 degrees centigrade and the thermal decomposition temperature of 320 degrees centigrade is subjected to the laser ablation. In the comparative example, it is found that dust is scattered to be attached to a peripheral area of a structural object. On the contrary, in the working example, attachment of the dust was hardly observed.

Figure 10A:
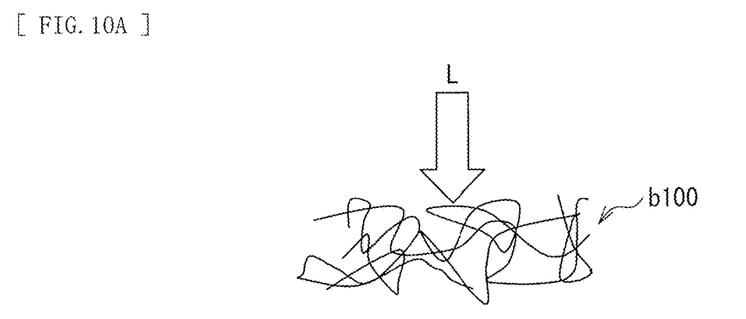
FIG. 10A is a schematic diagram for explaining a structure of resin that is used in the laser ablation according to the comparative example.
Figure 10B:
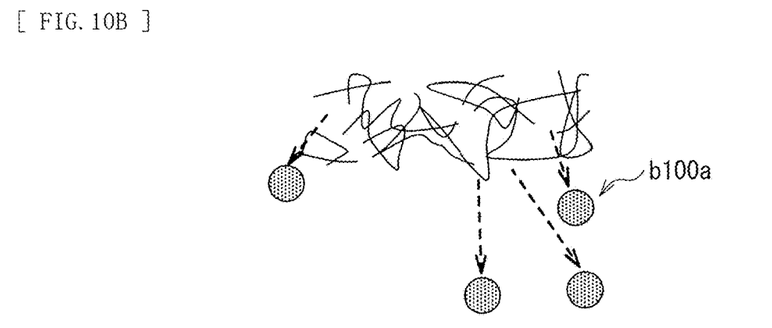
FIG. 10B is a schematic diagram for explaining the effect obtained by the resin structure illustrated in FIG. 10A.
Figure 11A:
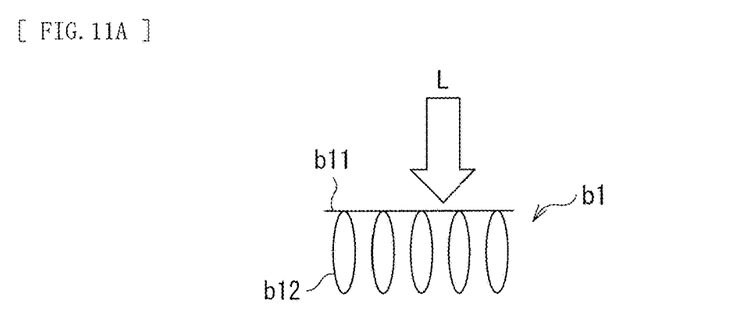
FIG. 11A is a schematic diagram for explaining a structure of cardo-type resin.
Figure 11B:
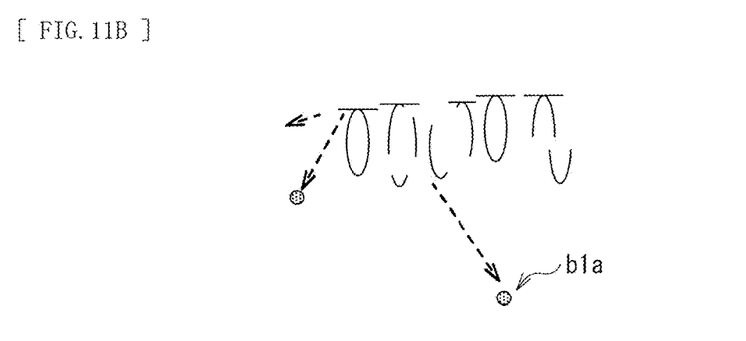
FIG. 11B is a schematic diagram for explaining the effect obtained by the resin structure illustrated in FIG. 11A.

As described above, in the present embodiment, the use of the resin allowing the difference between the glass-transition temperature and the thermal decomposition temperature to be not more than the predetermined temperature for the peel-off layer 22 (the resin layer 22a) makes it possible to suppress occurrence of the dust after a peel-off treatment with use of the laser ablation. This is achieved for the following reason. In other words, the polyimide-based resin that is used in the comparative example has the high thermal decomposition temperature (540 degrees centigrade) due to having a structure b100 in which a side chain is formed intricately as illustrated schematically in FIG. 10A, and therefore, the resin is less likely to be decomposed by energy of a laser beam. As a result, the softening (fluidization) temperature range of the resin becomes greater, and it is likely that a softened portion will be solidified to become dust (b100a), as illustrated schematically in FIG. 10B. On the contrary, in the present embodiment, the resin has the improved thermal resistance (the glass-transition temperature of 220 degrees centigrade) in spite of the low thermal decomposition temperature (320 degrees centigrade) due to having a cardo-type structure b1 in which bulky side chains b12 are attached to a main chain b11, as illustrated schematically in FIG. 11A. Consequently, the resin is likely to be decomposed by energy of a laser beam, and the softening temperature range of the resin becomes smaller. This results in reduction in the amount of dust (b1a) that occurs from a softened portion, as illustrated schematically in FIG. 11B.

Figure 12:
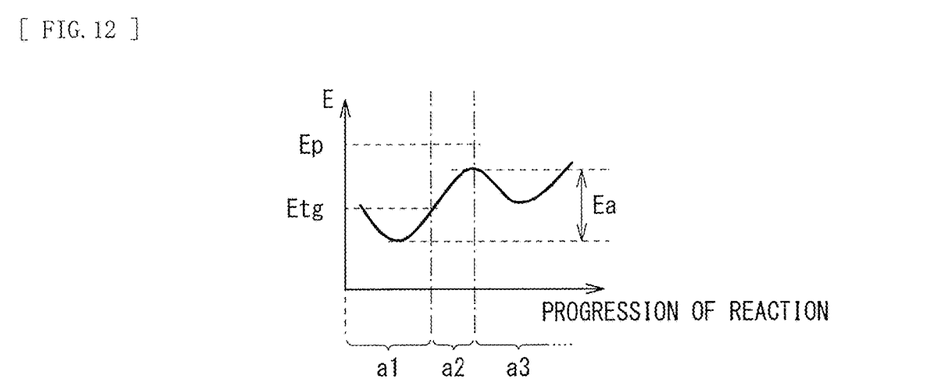
FIG. 12 is a characteristic diagram illustrating a relationship of a change in states of a solid, a fluid, and gas of resin versus energy.

The detailed description is provided below. That is, a state (a phase and a form) of the resin varies significantly depending on energy to be applied externally, as illustrated in FIG. 12. Specifically, the resin that is a solid at room temperature varies in the order of a solid a1, a fluid (liquid) a2, and gas a3 depending on energy that is supplied externally by means of light or heat, for example. Here, the gas a3 refers to a state where the resin suffers decomposition, specifically, a state where side chains of the resin are cut off by externally-supplied energy, and react with oxygen, etc. in the atmosphere to change into gas such as carbon dioxide. A boundary where the resin changes from the fluid a2 into the gas a3 is determined by activation energy Ea. More specifically, in a case where the energy that is supplied externally is greater than the activation energy Ea, the probability of gasification of the resin increases, and the probability of remaining in a state of the fluid a2 or the solid a1 decreases. It is to be noted that Etg in the diagram denotes energy that reaches the glass-transition temperature, and Ep denotes energy that reaches a plasma state.

Figure 13:
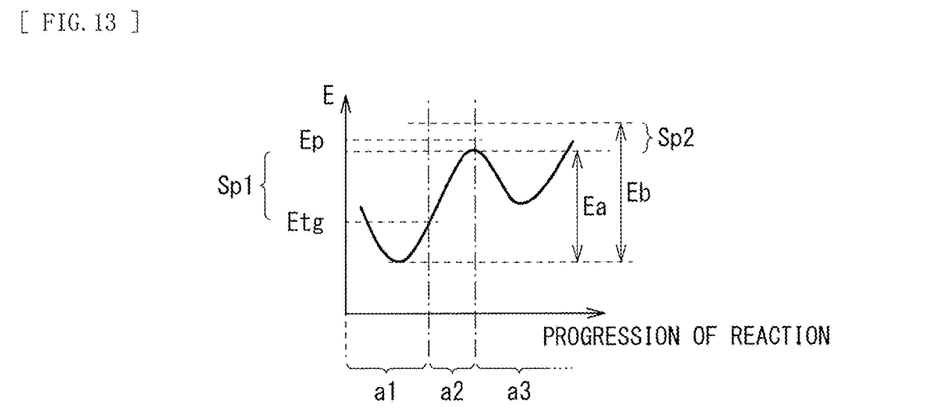
FIG. 13 is a characteristic diagram illustrating a relationship of a change in states of a solid, a fluid, and gas of resin according to the comparative example versus energy.

In such a change in state of the resin, in a case where promotion of gasification is desired, the thermal decomposition temperature itself and the difference between the glass-transition temperature and the thermal decomposition temperature are important as physical parameters. The reasons for this include two points given below. That is, in a case where the difference between the glass-transition temperature and the thermal decomposition temperature is great as in the comparative example illustrated in FIG. 13, the probability of becoming the fluid a2 is high due to the high activation energy Ea when a change in state of the resin is caused by energy Eb that is supplied externally (Sp1 in FIG. 13). Further, the probability of being put in a plasma state becomes very low (Sp2 in FIG. 13). When the resin in the fluid state spatters around due to ablation, such spattered resin is attached to a peripheral structural object, and is cooled by external air to return to the solid a1 again. The resin that is attached and solidified in such a manner has very high adherence to an underlying material, which makes it difficult to remove the resin through cleaning, for example.

Figure 14:
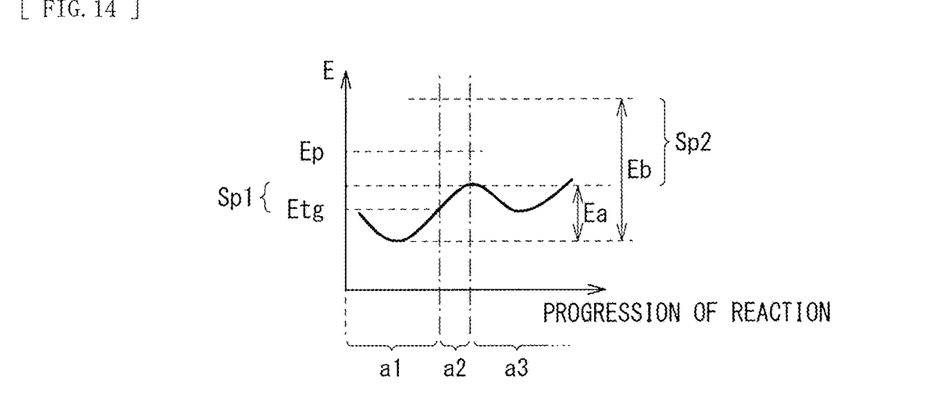
FIG. 14 is a characteristic diagram illustrating a relationship of a change in states of a solid, a fluid, and gas of resin according to the working example versus energy.

On the contrary, in the present embodiment, the difference between the glass-transition temperature and the thermal decomposition temperature is small, and therefore the activation energy Ea becomes smaller than that of the comparative example, as illustrated in FIG. 14. Consequently, when a change in state of the resin is caused by the energy Eb that is supplied externally, the probability of becoming the fluid a2 becomes low (Sp1 in FIG. 14). Further, the probability of being gasified to be put in a plasma state increases (Sp2 in FIG. 14). As a result, the resin is put in a plasma state by the laser ablation to be more likely to react, for example, with oxygen in the atmosphere, which promotes gasification. At the time of the laser ablation, this makes it possible to reduce the amount of the spattered resin in the fluid state as in the above-described comparative example, thereby allowing adherence of such spattered resin to a peripheral structural object as dust to be suppressed.

Further, in the present embodiment, for the resin included in the peel-off layer 22 (the resin layer 22a) as described above, vapor pressure at room temperature in an oxide, a nitride, and a carbide of an atom contained in side chains, for example, is preferably equal to or greater than the atmospheric pressure. In other words, it is preferable that the resin included in the resin layer 22a do not contain the atom in which each of the oxide, nitride, and carbide thereof becomes a solid in an environment of the room temperature and the atmospheric pressure. When the resin contains an atom of an element such as silicon (Si), the Si is separated from side chains of the resin by the supply of external energy equal to or greater than the activation energy to react with oxygen, nitrogen, etc. in the atmosphere. This results in generation of the oxide ($SiO_2$), the nitride (SiN), etc. These compounds is not gasified due to low vapor pressure to spatter around in a high-temperature state, and are attached to a peripheral structural object while further taking in decomposed C floating peripherally, for example. Such attached compounds have high adherence, which makes it difficult to remove those compounds. Therefore, by allowing the resin not to contain the atom that generates such an oxide, a nitride, and a carbide each having the low vapor pressure as a constituent atom (the oxide, nitride, and carbide of the atom contained in the resin have the high vapor pressure), it is possible to gasify most of constituent elements of the resin.

As described above, in the method of manufacturing the electronic device according to the present embodiment, in transferring the plurality of element sections 10 from the second substrate 21 onto the first substrate 11, the element sections 10 (10a) are formed on the second substrate 21 with the peel-off layer 22 in between, and the element sections 10 (10a) are peeled off from the second substrate 21 using laser irradiation performed on the peel-off layer 22. With use of such laser ablation using the peel-off layer 22, the selective element sections 10 (10a) are transferred from the second substrate 21 onto the first substrate 11. Here, the use of the resin having the glass-transition temperature and the thermal decomposition temperature that differ from each other by 150 degrees centigrade or less for the peel-off layer 22 makes it possible to suppress softening of the resin at the time of ablation. This makes it possible to suppress spattering of the softened resin and adherence of such spattered resin as dust. As a result, this allows deterioration in the reliability to be suppressed.

[Modification Example 1]

In the above-described embodiment, the description is provided on the method of transferring the selective element sections 10 (10a) among the plurality of element sections 10 on the first substrate 11 from another substrate (the second substrate 21). However, the laser ablation using the resin as described above is also applicable to any other processes. For example, like the present modification example, the above-described resin may be used for a peel-off layer in transferring the element sections 10 in a state of being peeled off after bonding. It is to be noted that any component parts similar to those in the above-described embodiment are denoted with the same reference numerals, and the related descriptions are omitted as appropriate.

Figure 15A:
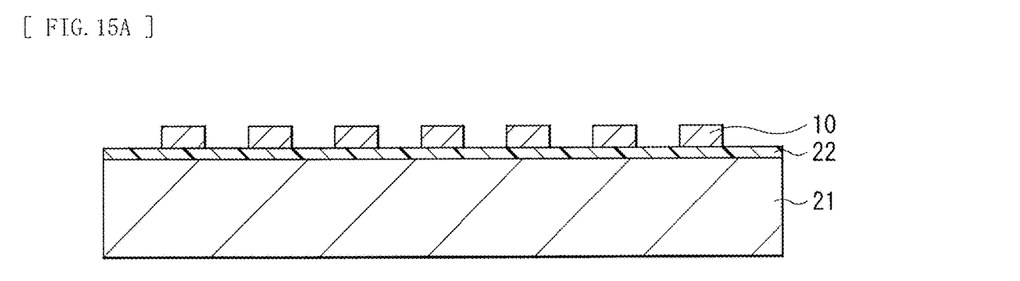
FIG. 15A is a cross-sectional schematic diagram for explaining a method of manufacturing an electronic device according to a modification example 1.

Specifically, in the first place, the element sections 10 are formed on the second substrate 21 with the peel-off layer 22 in between, as illustrated in FIG. 15A. As a method of forming the element sections 10, various methods such as plating joint, solder joint, or bonding may be used, as with the above-described embodiment. It is to be noted that, in the present modification example, the peel-off layer 22 may be formed for each of the element sections 10, or may be formed over a whole surface of the second substrate 21.

Figure 15B:
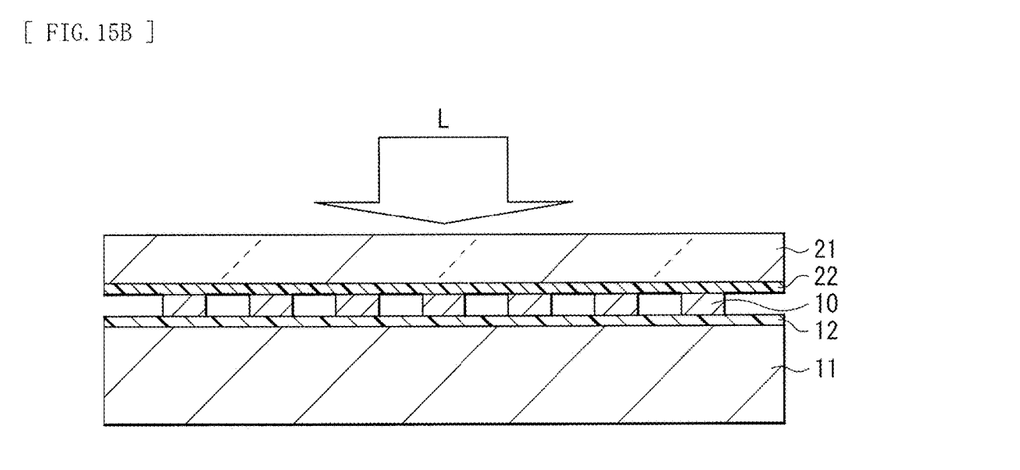
FIG. 15B is a cross-sectional schematic diagram illustrating a peel-off process with use of laser irradiation according to the modification example 1.

Thereafter, the first substrate 11 (specifically, the bonding layer 12) and the second substrate 21 on which the plurality of element sections 10 are formed are bonded together, as illustrated in FIG. 15B. At this time, the first substrate 11 and the second substrate 21 are bonded to face each other in such a manner that the element sections 10 are disposed between the first substrate 11 and the second substrate 21. At least either one of the first substrate 11 and the second substrate 21 is held on a movable stage, and is driven to be fixed at the above-described predetermined position.

With the first substrate 11 and the second substrate 21 bonded together, the peel-off layer 22 is irradiated with the laser beam L. The laser beam L is emitted from the second substrate 21 side. As a wavelength of the laser beam L, a wavelength of light is selected that passes through the second substrate 21, and is absorbed selectively on the peel-off layer 22. Further, an irradiation diameter and an output intensity, etc. of the laser beam L are set up to allow a whole surface of the peel-off layer 22 to be uniformly irradiated with the laser beam L.

Figure 15C:
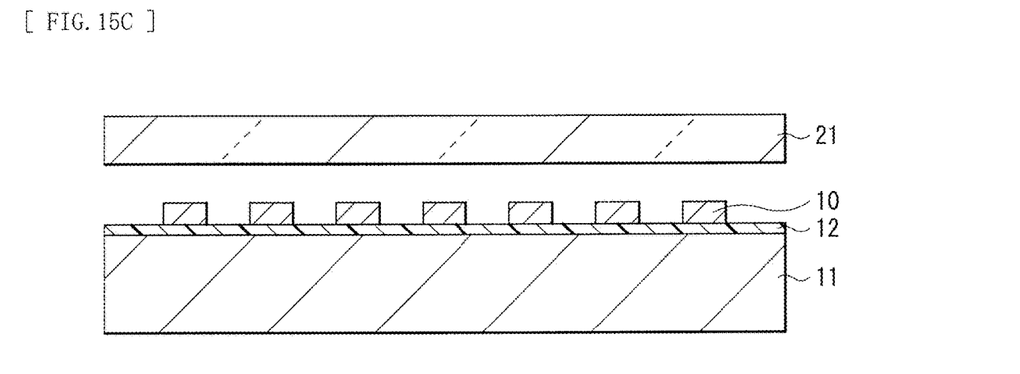
FIG. 15C is a cross-sectional schematic diagram illustrating a process following the process illustrated in FIG. 15B.

As illustrated in FIG. 15C, this causes part or all of the peel-off layer 22 to be gasified (subjected to the ablation). As a result, the plurality of element sections 10 are peeled off from the second substrate 21 to be dropped down on the bonding layer 12 that is positioned directly beneath, and are fixed as they are by the bonding layer 12. Thereafter, the second substrate 21 is separated from the first substrate 11. In such a manner, the laser ablation with use of the peel-off layer 22 makes it possible to transfer the plurality of element sections 10 from the second substrate 21 onto the first substrate 11. Here, after the element sections 10 are peeled off, part of the resin included in the peel-off layer 22 is not gasified, and is left on the element sections 10a in an original solid state (the resin layer 22a is formed at least part of the element sections 10a). The resin layer 22a may be removed, as in the above-described embodiment.

Like the present modification example, also in a case where the element sections 10 are peeled off with use of the laser ablation after bonding of the substrates, the use of the resin similar to that used in the above-described embodiment for the peel-off layer 22 makes it possible to suppress softening of the resin in the event of a change in phase of the resin during the ablation. As a result, it is possible to achieve effects similar to those obtained in the above-described embodiment.

A description has been given thus far with reference to the embodiment and the modification example; however, the disclosure is not limited to the embodiment and the modification example, but various modifications may be made. For example, in the above-described embodiment, the description is provided taking as an example a case where the plurality of element sections 10 are disposed on the first substrate 11; however, the single element section 10 may be disposed.

Further, in the above-described embodiment, etc., the description is provided taking as an example a case where the element section 10 includes a light-emitting element or a light-receiving element. However, the element section of the disclosure is not limited to the light-emitting element, etc., and the element section may include any other semiconductor element. Examples of the semiconductor element include a thin-film transistor and a resistor. Further, as an alternative to the semiconductor element, an element including a conductive film such as a wiring trace may be also permitted. For example, the resin of the disclosure is usable for a peel-off layer in transferring and forming a wiring (electrically-conductive film) pattern with use of the laser ablation.

Further, in the above-described embodiment, etc., the laser ablation at the time of transferring the element sections in a manufacturing process of the electronic device is taken as an example; however, the laser ablation using the resin of the disclosure is also applicable to any other process. For example, the resin of the disclosure may be used as underlying resin at the time when trimming is performed with use of the laser ablation on a wiring substrate whose base is made of resin. Further, the resin of the disclosure may be widely applicable in performing direct patterning of resin with use of the laser ablation, or in a process of performing a resin treatment with use of any other laser.

In addition, in the above-described embodiment, etc., it is possible to further reduce occurrence of dust by combining selection of the resin as described above, and settings of irradiation conditions of a laser beam, in a manner of, for example, changing a laser output, a wavelength, pulse intervals, etc. at the time of ablation to raise power to be supplied. For example, it is possible to promote plasma activation efficiently by adjusting pulse intervals using femtosecond laser.

It is to be noted that the content of the disclosure may be configured as follows.

(1)
An electronic device including:
one or a plurality of element sections that are disposed on a first substrate; and
a resin layer that is formed on at least part of each of the one or the plurality of element sections, wherein
the resin layer includes resin having glass-transition temperature and thermal decomposition temperature that differ from each other by 150 degrees centigrade or less.

(2)
The electronic device according to (1), wherein vapor pressure of an oxide, a nitride, and a carbide of an atom contained in the resin is equal to or greater than atmospheric pressure.

(3)
The electronic device according to (1) or (2), wherein the thermal decomposition temperature is 350 degrees centigrade or less.

(4)
The electronic device according to any one of (1) to (3), wherein the resin is a polymer material having a cardo structure.

(5)
The electronic device according to any one of (1) to (4), wherein
the plurality of element sections are disposed on the first substrate, and
the element sections each include a light-emitting element or a light-receiving element.

(6)
The electronic device according to any one of (1) to (5), wherein the one or the plurality of element sections are each an electrically-conductive film.

(7)
A method of manufacturing an electronic device, the method including:
in transferring one or a plurality of element sections onto a first substrate from a second substrate,
forming part or all of the one or the plurality of element sections on the second substrate with a resin layer in between;
peeling off the one or the plurality of element sections that are formed on the second substrate from the second substrate through laser irradiation performed on the resin layer, and disposing, onto the first substrate, the one or the plurality of element sections peeled off; and using, as the resin layer, resin having glass-transition temperature and thermal decomposition temperature that differ from each other by 150 degrees centigrade or less.

(8)
The method according to (7), wherein vapor pressure of an oxide, a nitride, and a carbide of an atom contained in the resin is equal to or greater than atmospheric pressure.

(9)
The method according to (7) or (8), wherein the thermal decomposition temperature is 350 degrees centigrade or less.

(10)
The method according to any one of (7) to (9), wherein
a plurality of first element sections corresponding to part of the plurality of element sections are formed on the second substrate with the resin layer in between,
the second substrate on which the plurality of first element sections are formed is disposed to face the first substrate with the plurality of first element sections in between, and,
after the second substrate is disposed to face the first substrate, the resin layer is irradiated with a laser beam in a region corresponding to one or a plurality of selective first element sections among the plurality of first element sections.

(11)
The method according to (10), further including, after the irradiation of the laser beam, removing the resin layer that is formed on the first element sections.

(12)
The method according to any one of (7) to (11), wherein
the plurality of element sections are formed on the second substrate with the resin layer in between,
the second substrate on which the plurality of element sections are formed is bonded to the first substrate with the plurality of element sections in between, and
the resin layer is irradiated with a laser beam after the second substrate is bonded to the first substrate.

(13)
The method according to (12), further including, after the irradiation of the laser beam, removing the resin layer formed on the element sections.

(14)
The method according to any one of (7) to (13), wherein the resin is a polymer material having a cardo structure.

(15)
The method according to any one of (7) to (14), wherein the one or the plurality of element sections each include a light-emitting element or a light-receiving element.

(16)
The method according to any one of (7) to (15), wherein the one or the plurality of element sections are each an electrically-conductive film.

This application claims the priority on the basis of Japanese Patent Application No. 2015-069261 filed on Mar. 30, 2015 in Japan Patent Office, the entire contents of which are incorporated in this application by reference.

Those skilled in the art could assume various modifications, combinations, subcombinations, and changes in accordance with design requirements and other contributing factors. However, it is understood that they are included within a scope of the attached claims or the equivalents thereof.

The invention claimed is:
1. An electronic device comprising:
one or a plurality of element sections that are disposed on a first substrate; and
a resin layer that is formed on at least part of each of the one or the plurality of element sections, wherein
the resin layer includes resin having a glass-transition temperature and a thermal decomposition temperature that differ from each other by 150 degrees centigrade or less.

2. The electronic device according to claim 1, wherein a vapor pressure of an oxide, a nitride, and a carbide of an atom contained in the resin is equal to or greater than atmospheric pressure.

3. The electronic device according to claim 1, wherein the thermal decomposition temperature is 350 degrees centigrade or less.

4. The electronic device according to claim 1, wherein the resin is a polymer material having a cardo structure.

5. The electronic device according to claim 1, wherein
the plurality of element sections are disposed on the first substrate, and
the element sections each include a light-emitting element or a light-receiving element.

6. The electronic device according to claim 1, wherein the one or the plurality of element sections are each an electrically-conductive film.

7. A method of manufacturing an electronic device, the method comprising:
transferring one or a plurality of element sections onto a first substrate from a second substrate,
wherein the transferring step comprises:
forming part or all of the one or the plurality of element sections on the second substrate with a resin layer in between;
peeling off the one or the plurality of element sections that are formed on the second substrate from the second substrate through laser irradiation performed on the resin layer, and disposing, onto the first substrate, the one or the plurality of element sections peeled off; and
using, as the resin layer, resin having a glass-transition temperature and a thermal decomposition temperature that differ from each other by 150 degrees centigrade or less.

8. The method according to claim 7, wherein a vapor pressure of an oxide, a nitride, and a carbide of an atom contained in the resin is equal to or greater than atmospheric pressure.

9. The method according to claim 7, wherein the thermal decomposition temperature is 350 degrees centigrade or less.

10. The method according to claim 7, wherein
a plurality of first element sections corresponding to part of the plurality of element sections are formed on the second substrate with the resin layer in between,
the second substrate on which the plurality of first element sections are formed is disposed to face the first substrate with the plurality of first element sections in between, and,
after the second substrate is disposed to face the first substrate, the resin layer is irradiated with a laser beam in a region corresponding to one or a plurality of selective first element sections among the plurality of first element sections.

11. The method according to claim 10, further comprising, after the irradiation of the laser beam, removing the resin layer that is formed on the first element sections.

12. The method according to claim 7, wherein
the plurality of element sections are formed on the second substrate with the resin layer in between,
the second substrate on which the plurality of element sections are formed is bonded to the first substrate with the plurality of element sections in between, and
the resin layer is irradiated with a laser beam after the second substrate is bonded to the first substrate.

13. The method according to claim 12, further comprising, after the irradiation of the laser beam, removing the resin layer formed on the element sections.

14. The method according to claim 7, wherein the resin is a polymer material having a cardo structure.

15. The method according to claim 7, wherein the one or the plurality of element sections each include a light-emitting element or a light-receiving element.

16. The method according to claim 7, wherein the one or the plurality of element sections are each an electrically-conductive film.

\* \* \* \* \*